US006917901B2

(12) United States Patent
Bowley, Jr. et al.

(10) Patent No.: US 6,917,901 B2
(45) Date of Patent: Jul. 12, 2005

(54) CONTACT HOLE PROFILE AND LINE EDGE WIDTH METROLOGY FOR CRITICAL IMAGE CONTROL AND FEEDBACK OF LITHOGRAPHIC FOCUS

(75) Inventors: Reginald R. Bowley, Jr., Essex Junction, VT (US); Vincent J. Carlos, Essex Junction, VT (US); James E. Doran, Essex Junction, VT (US); Stephen E. Knight, Essex Junction, VT (US); Robert K. Leidy, Burlington, VT (US); Keith J. Machia, Swanton, VT (US); Joseph E. Shaver, South Burlington, VT (US); Dianne L. Sundling, Huntington, VT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 10/079,389

(22) Filed: Feb. 20, 2002

(65) Prior Publication Data

US 2003/0158710 A1 Aug. 21, 2003

(51) Int. Cl.$^7$ ................................................. G03C 5/00
(52) U.S. Cl. ....................... 702/189; 702/155; 702/170; 430/30
(58) Field of Search ............................ 702/189, 40, 35, 702/85, 90, 95, 97, 104, 103, 113, 116, 117, 118, 130, 152, 155, 157–159, 166, 167, 170, 172, 127, 182, 183, FOR 123–FOR 125, FOR 131, FOR 139–FOR 136, FOR 141, FOR 145–FOR 148, FOR 152, FOR 157, FOR 176; 700/120, 121, 302, 303; 430/30, 5, 22, 294, 312, 313, 394; 356/635, 399–401, 624, 636; 355/55, 52, 53; 250/554.36, 559.14, 559.22, 559.24, 559.26, 201.4, 252.5; 438/14, 16; 716/21

(56) References Cited

U.S. PATENT DOCUMENTS

| 5,532,090 A | | 7/1996 | Borodovsky | .................... 430/5 |
| 5,656,182 A | | 8/1997 | Marchman et al. | ............ 430/4 |
| 5,750,294 A | * | 5/1998 | Hasegawa et al. | ............ 430/22 |

(Continued)

FOREIGN PATENT DOCUMENTS

| JP | 6-294625 | 10/1994 |
| JP | 11-186132 | 7/1999 |
| JP | 2000-12426 | 1/2000 |

OTHER PUBLICATIONS

Su et al., "Sidewall angle measurements using CD SEM", Sep. 23–25, 1998, IEEE, Advanced Semiconductor Manufacturing Conference and Workshop, pp. 259–261.*

Primary Examiner—Hal Wachsman
(74) Attorney, Agent, or Firm—Scully, Scott, Murphy & Presser; William D. Sabo, Esq.

(57) ABSTRACT

A method uses three dimensional feature metrology for implementation of critical image control and feedback of lithographic focus and x/y tilt. The method is for measuring 3 dimensional profile changes in a photo sensitive film and feeding back compensatory exposure tool focus corrections to maintain a stable lithographic process. The measured focus change from the optimal tool focus offset is monitored directly on the critical product images for both contact hole and line images. Z Focus corrections and x/y tilt corrections are fed back independently of dose to maintain critical dimension (CD) control thereby achieving improved semiconductor wafer printing. Additionally, the method can be used to diagnose problems with the focusing system by measuring the relationship between line edge width and barometric pressure.

26 Claims, 18 Drawing Sheets

U.S. PATENT DOCUMENTS

| | | | |
|---|---|---|---|
| 5,756,238 A | 5/1998 | Barr et al. | 430/5 |
| 5,914,784 A | 6/1999 | Ausschnitt et al. | 356/624 |
| 5,969,273 A * | 10/1999 | Archie et al. | 73/865.8 |
| 5,976,740 A * | 11/1999 | Ausschnitt et al. | 430/30 |
| 6,021,009 A | 2/2000 | Borodovsky et al. | 359/888 |
| 6,027,842 A | 2/2000 | Ausschnitt et al. | 430/30 |
| 6,049,660 A | 4/2000 | Ahn et al. | 703/13 |
| 6,190,810 B1 | 2/2001 | Lai et al. | 430/22 |
| 6,509,952 B1 * | 1/2003 | Govil et al. | 355/52 |
| 2003/0048458 A1 * | 3/2003 | Mieher et al. | 356/601 |

\* cited by examiner

TABLE OF RUN RULES

| 1310 TOOL | 1320 TECHNOLOGY | 1330 WAFERPN | 1340 PROCESS | 1350 OPT | 1360 DEFAULT EXPOSURE | 1370 FOCUS |
|---|---|---|---|---|---|---|
| U82V | ICE8S3D | * | MC | F | 19.00 | 0.10 |
| U82V | ICEC8S2 | * | MC | F | 19.00 | 0.10 |
| U82V | ICEC8S3 | * | MC | F | 19.00 | 0.10 |
| U84V | CMOS6X1 | * | MC | F | 20.00 | 0.00 |
| U86V | CSO19S0 | * | MC9S | F | 24.00 | -0.10 |
| U86V | CSO19S0 | 0000008J0640 | MC9S | F | 30.00 | -0.10 |
| U86V | CSO19S0 | 0000008J0645 | MC9S | F | 30.00 | -0.10 |
| U86V | CSO19S0 | 0000057P6438 | MC9S | F | 28.00 | -0.05 |
| U86V | CSO19S2 | * | MC9S | F | 25.00 | -0.10 |
| U92V | CSO19S0 | * | MC9S | F | 24 | -0.10 |
| U92V | CSO19S0 | 0000008J0639 | MC9S | F | 30.00 | -0.10 |
| U92V | CSO19S0 | 0000008J0640 | MC9S | F | 30.00 | -0.10 |

FIG. 13
(PRIOR ART)

CONTACT HOLE PROFILE AND LINE EDGE WIDTH METROLOGY FOR CRITICAL IMAGE CONTROL AND FEEDBACK OF LITHOGRAPHIC FOCUS

DESCRIPTION

1. Field of the Invention

The present invention broadly relates to an improvement in wafer semiconductor printing in the field of photolithography. More particularly, it relates to a method of maintaining optimum focus through a process control system that uses a control algorithm translating Critical Dimension (CD) and line edge width measurements into a corresponding focus adjustment which is fed back to an exposure tool.

2. Background of the Invention

In the field of integrated circuits (ICs), photolithography is used to transfer patterns, i.e. images, from a mask containing circuit-design information to thin films on the surface of a substrate, e.g. Si wafer. The pattern transfer is accomplished with a photoresist (e.g., an ultraviolet light-sensitive organic polymer). In a typical image transfer process, a substrate that is coated with a photoresist is illuminated through a mask and the mask pattern is transferred to the photoresist by chemical developers. Further pattern transfer is accomplished using a chemical etchant. In current technologies, this masking process usually is repeated multiple times in the fabrication of an integrated circuit.

FIG. 1 illustrates a typical photolithographic processing (fab) environment comprising a mask 110, a stepper device 120 with lens 130 through which the exposure energy 140 is focused on a wafer 150 coated with a photoresist 160.

It is well known in the field of photolithography that Critical Dimension may change as a result of either effective exposure or tool focus. Prior art tool focus control monitoring and feed back is achieved by imaging a specific image design on non-patterned test wafers with individual exposure fields stepped through a range of z focus. It is a well known practice to define the center of the focus step range yielding the best image CD stability as the nominal tool focus. This image stability has, in the past, either been subjectively determined by reading focus "dots" under a microscope or by measuring a change in 2 dimensional line width on a pattern such as a photoresist chevron or measuring the foreshortening of a series of lines and spaces. The result of this prior art method is that an offset from this nominal tool focus to product focus of a specific masking level must be controlled by implementing a table of run rules, as shown in FIG. 13. In the table of run rules, the focus 1370, default exposure 1360, are related to the tool 1310, technology 1320, wafer part number 1330 and process 1340. Under the prior art method, the optimal product focus offset is a fixed offset. It is well known in the industry, however, that for a given photolithographic exposure tool, there is variability of nominal tool focus. Thus, optimal product focus offset is variable as a result of the inherent tool focus variation. This prior art technique has thus required that two dimensional critical dimension be monitored on product masking levels so that shifts in CD are compensated for by feeding back a change in dose to the exposure tool. As discussed below, the related art has not solved the problem of real time variation in optimal product focus offset due to photolithographic exposure tool nominal focus instability.

A related art technique for across field dimensional control in a microlithography tool is described in Borodovsky (U.S. Pat. No. 6,021,009) which is directed to a lithography tool adjustment method through which light intensity is varied to reduce line width variations. This process however, does not measure critical features to determine a z focus parameter, nor does it differentiate between feature error components due to focus shift and other process factors.

Another related art method is described in Lai (U.S. Pat. No. 6,190,810 B1) which utilizes a single spot laser focusing system in which the laser light spot is always positioned between a series of registration marks. However, Lai does not teach the use of critical design features, i.e. line edge width (EW) and contact hole profile, for z focus control.

Another related art technique described in Marchman (U.S. Pat. No. 5,656,182) utilizes feedback control, however, Marchman does not address attainment of the optimum CD, given tool configuration, calibration, and specification values. Rather it merely performs stage position control as a function of the latent image produced in the substrate.

A further related art technique described in Tadayoshi (JP 6294625 A) discloses a laser beam microscope means for determining the dimensions and profile of a resist pattern but does not disclose analysis of the profile information for z focus control of a photolithographic exposure tool.

Similarly, a related art technique described in Atsushi (JP 11186132 A) discloses resist pattern width measurements to determine an allowable exposure dose range. This disclosure, however does not address the issue of using 3 dimensional resist measurements to feedback a focus bias or to differentiate between a lithography tool focus shift and other process factors.

While the technique of using feedback control using 2 dimensional metrology to overcome a shift in critical dimension due to exposure variation is known in the art, there remains a need in the art for the capability to compensate for tool focus variation directly on product.

It would thus be highly desirable to provide a system and method for independently controlling the variation in optimal product focus offset due to instability in the photolithographic exposure tool, thus obviating the above-mentioned drawbacks of related art techniques.

It would be further highly desirable to provide a system and method of compensating for variation in optimal product focus offset, i.e., correcting focus errors, of a photolithographic exposure tool implementing a production or similar reticle, using a production wafer, and particularly, a system and method that provides CD control by successfully predicting z focus and x and y tilt, while isolating the focus control in the exposure tool from other factors.

SUMMARY OF THE INVENTION

Therefore, it is an object of the present invention to provide a photolithographic system and method that provides for focus feedback corrections independently of dose to maintain critical dimension control.

Another object of the present invention is to provide the capability for determining directly on a product image if a change in monitored CD is a function of lithography tool z focus shift, x/y tilt shift, or a change in effective exposure or resist sensitivity.

A further object of the present invention is to provide the capability for correcting lithographic z focus variation and/or x/y tilt shifts when detected.

These and other objects and advantages may be obtained in the present invention by providing a method for monitoring 3-dimensional contact hole profile changes and 3-dimensional line Edge Width (EW) changes in a photo sensitive film and feeding back compensatory exposure tool focus/tilt corrections to maintain a stable lithographic process.

Specifically, according to a first aspect of the invention, there is provided a method of controlling focus and x/tilt errors of a photolithographic exposure tool which comprises: making feature measurements of three dimensional profile changes in a photosensitive resist; storing the feature measurements; generating a function defining a relationship between the feature measurements and focus of the photolithographic exposure tool; and, computing from the function a best profile. The method may also be implemented in a system comprising the photolithographic exposure tool and computer.

Additionally, the present invention uses empirically derived relationships with 3 dimensional feature measurements for z focus and x/y tilt control. The offset between nominal tool focus and product best focus for a specific masking level is hereinafter referred to as optimal product focus offset. Moreover, this optimum product focus offset per level varies with parameters such as the masking level, specific resist and arc thickness, exposure illumination type and reticle design (Chrome On Glass, i.e., COG vs. Attenuating Phase Shift Mask, i.e., ATPSM, etc).

According to another aspect of the invention, there is provided a system and method comprising the steps of: making feature measurements of three dimensional profile changes in a photosensitive resist; storing the measurements; generating a function which defines a relationship between the feature measurements and the focus of the photolithographic exposure tool; and, computing from said function x/y tilt values wherein the x/y tilt values are used to control the exposure tool thereby achieving an optimum x/y tilt offset. The wafer is then printed at the optimal product focus offset and optimum x/y tilt offsets determined by the inventive steps, thereby improving critical product image quality.

BRIEF DESCRIPTION OF THE DRAWINGS

The present invention, which provides a method of photolithographic exposure tool focus, will now be described in more detail by referring to the drawings that accompany the present application. It is noted that in the accompanying drawings like reference numerals are used for describing like and corresponding elements thereof.

FIG. 13 illustrates a table of run rules, used in a prior art method for controlling focus.

DETAILED DESCRIPTION OF THE INVENTION

In the following description, the best profile computed from the function is defined to be the optimal product focus offset. In practice the best profile and optimal product focus offset may not be identical because of asymmetry of the overall process window, which results in a bias added to best profile in order to obtain optimal product focus offset. Z focus errors measured using the first aspect of the invention are used to determine the change from the optimal product focus offset, which are then fed back to the exposure tool.

Figure 1:
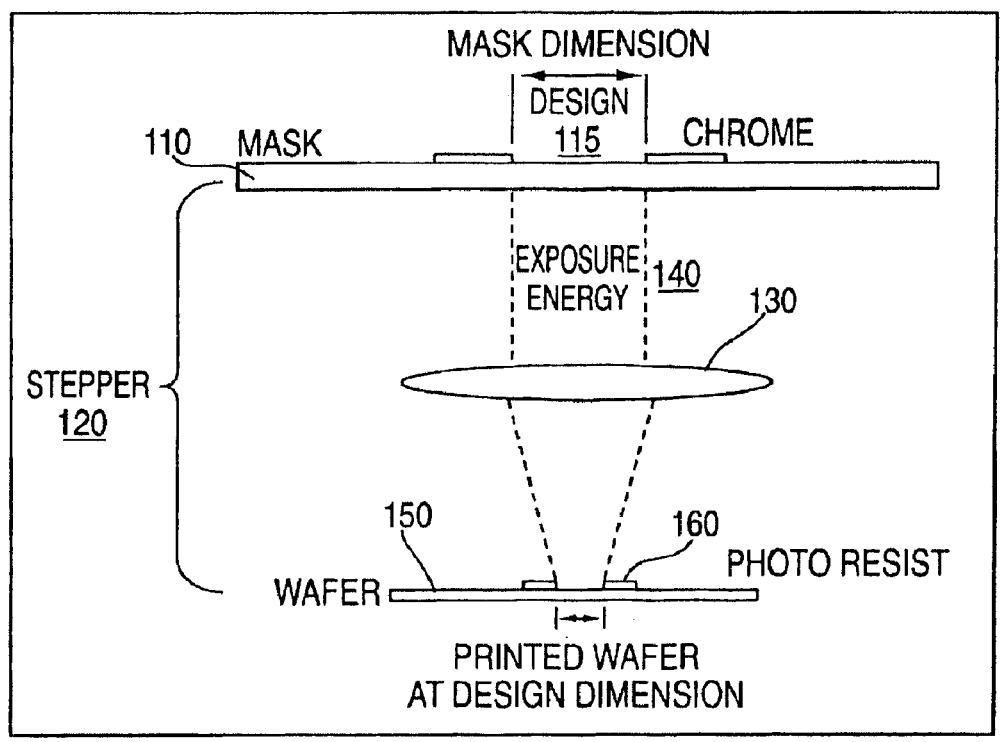
FIG. 1 depicts the main components of a prior art photolithographic processing system to which the present invention is directed.

In view of FIG. 1, a mask, i.e. reticle, 110, with critical design features representing a process and level for a target critical dimension is placed in a stepper tool 120. The stepper tool is used to project a design pattern 115 from the mask, i.e., reticle 110 onto and exposing a photoresist layer 160 that coats semiconductor wafer 150. A photoresist treated wafer, typically a focus expose matrix wafer is mounted on the tool in preparation for various calibration field exposures. Field exposures are made across the rows and down the columns of the focus expose matrix wafer. Either during the field exposures, or after the field exposures have been completed, 3 dimensional profile measurements of the design features, which have been transferred to the resist, are made and recorded for data processing.

Figure 1A:
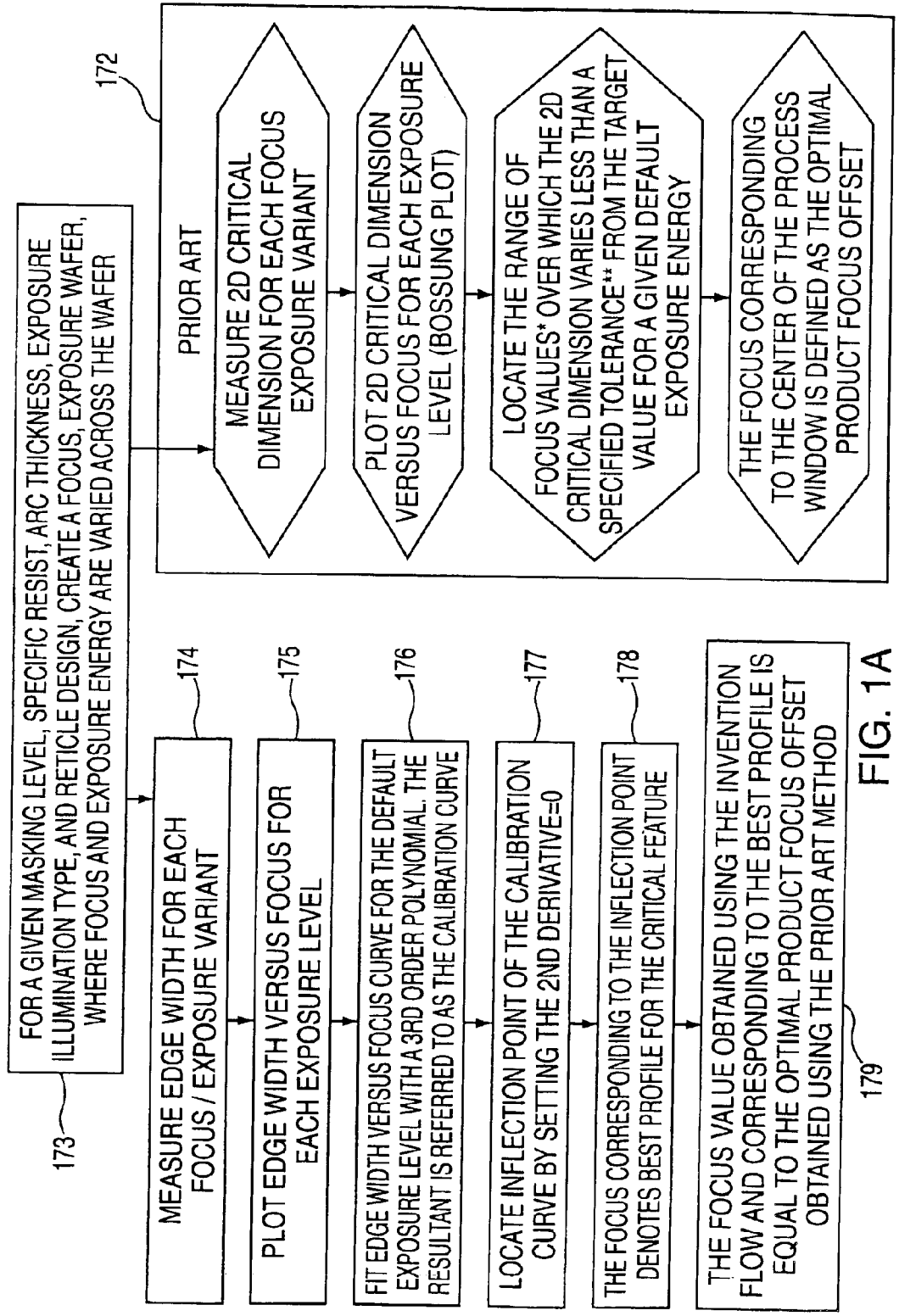
FIG. 1A illustrates a functional block diagram for calibration using a preferred implementation of the present invention in the manufacturing set up phase.
Figure 1C:
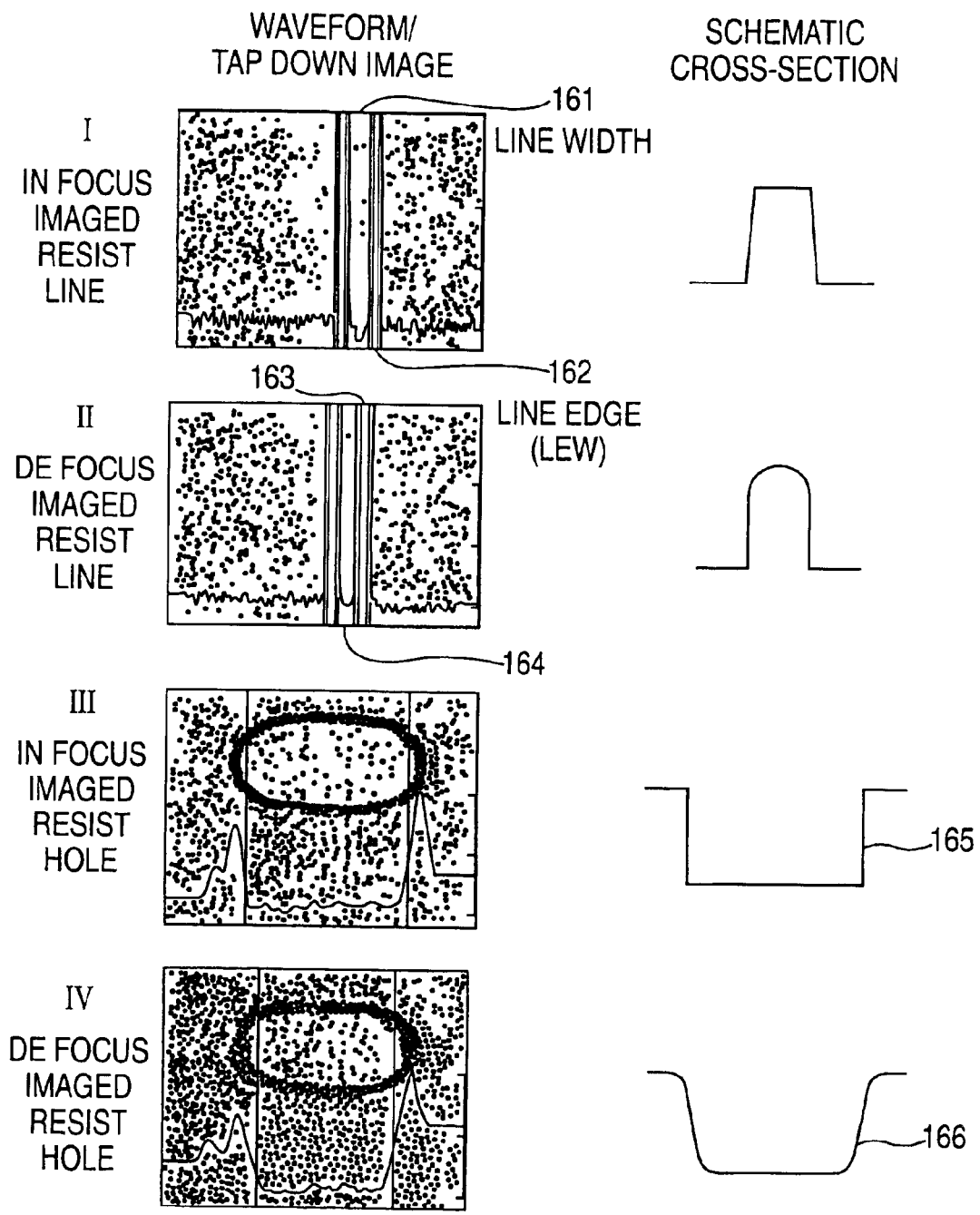
FIG. 1C shows scanning electron microscope (SEM) micrographs of exposure fields with critical features, i.e. 3d line edge width and 3d contact hole profile for focus metrology.
Figure 1D:
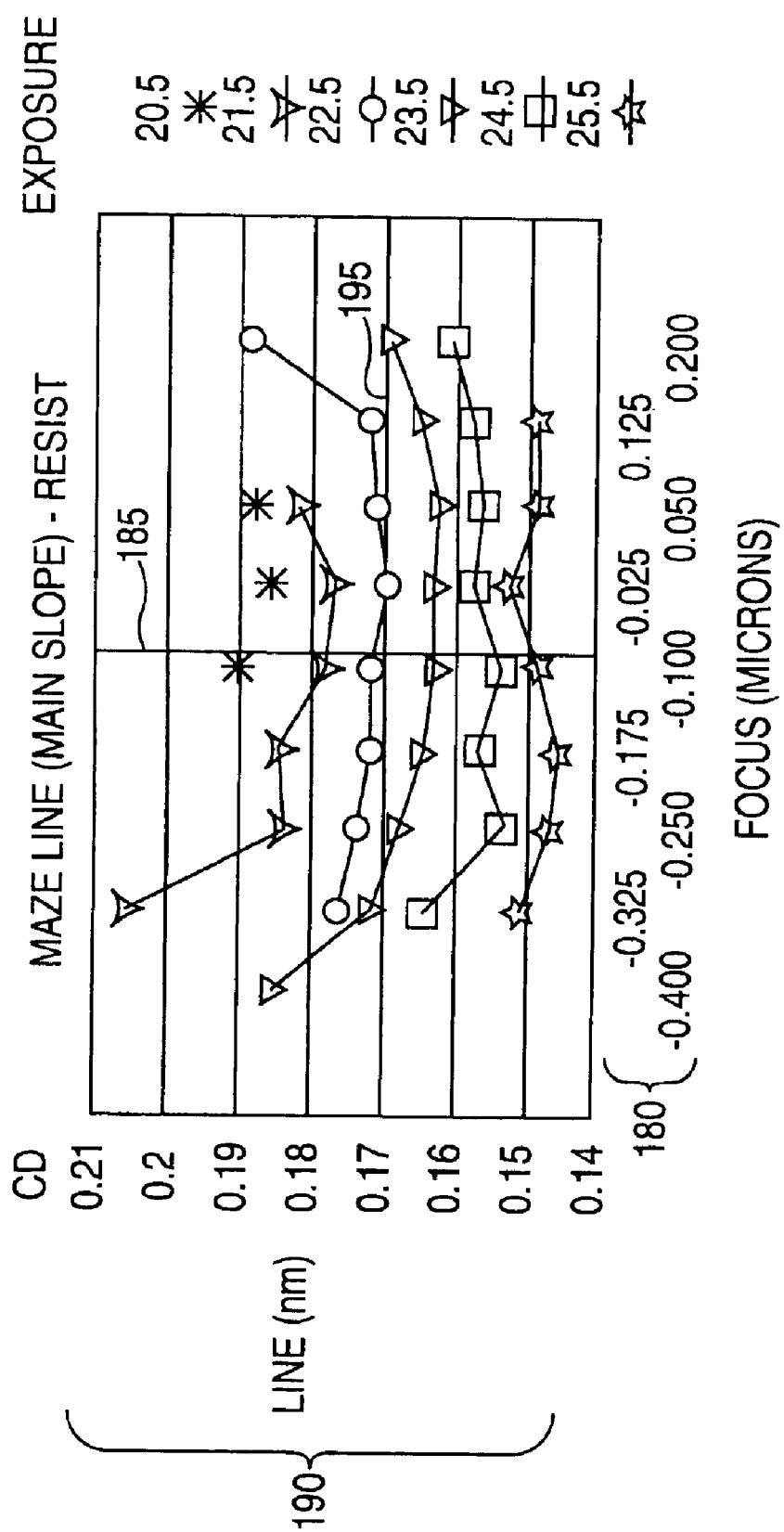
FIG. 1D is a graphic plot illustrating the Maze Line resist line width versus focus plot for various exposures, Maze Line is a term which denotes a specific line/space pattern.
Figure 2:
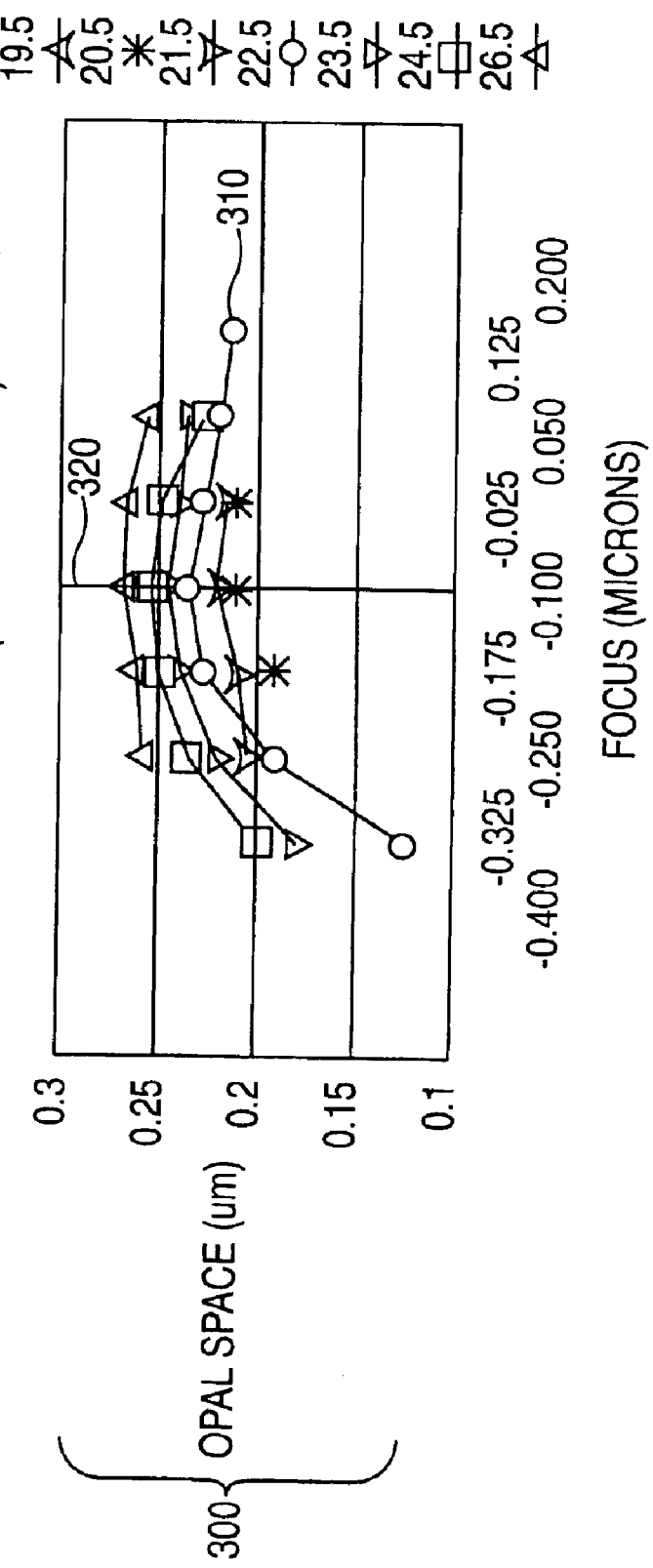
FIG. 2 illustrates the contact dimension (space) change with focus and/or exposure.
Figure 3:
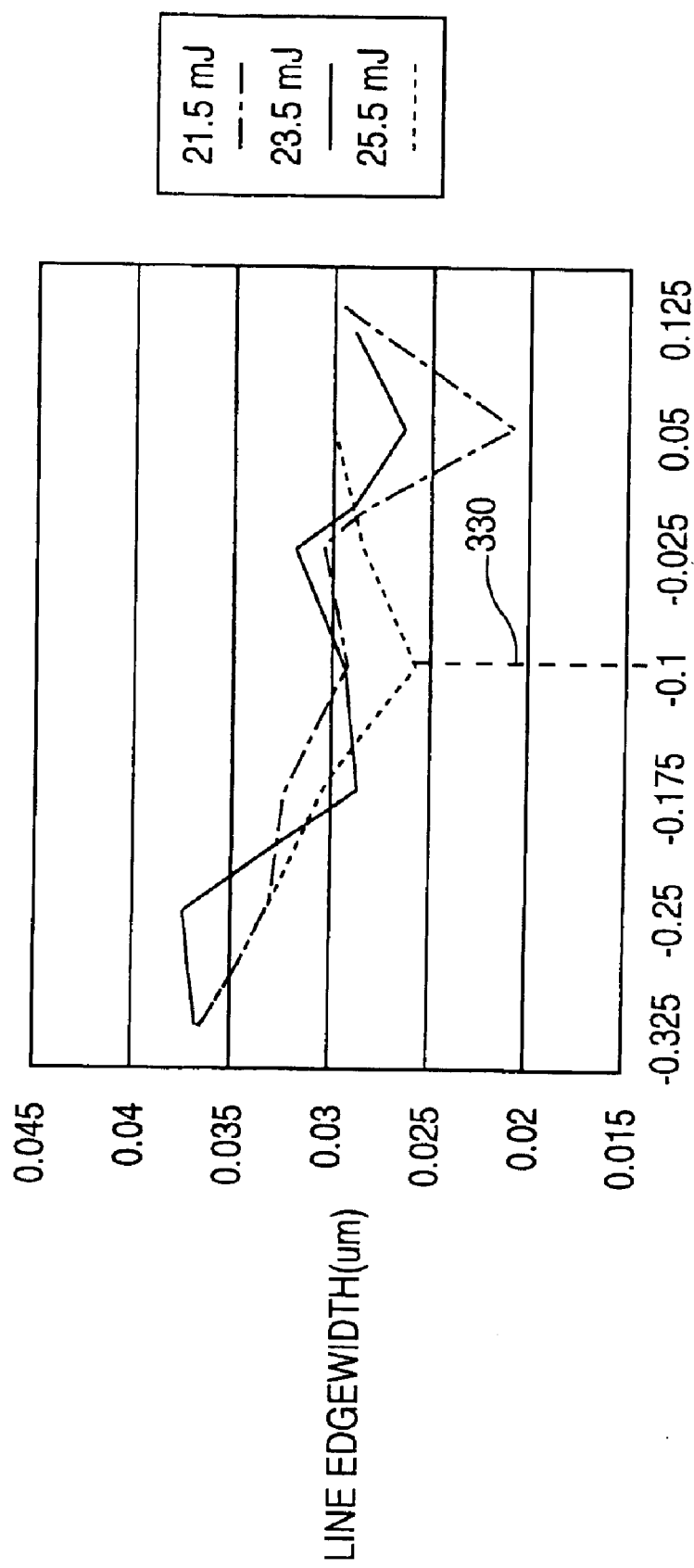
FIG. 3 illustrates the graph of profile change vs. focus, i.e., resist line edge versus focus obtained by measuring a 3 dimensional change in resist profile at a fixed dose for nominal CD.
Figure 4:
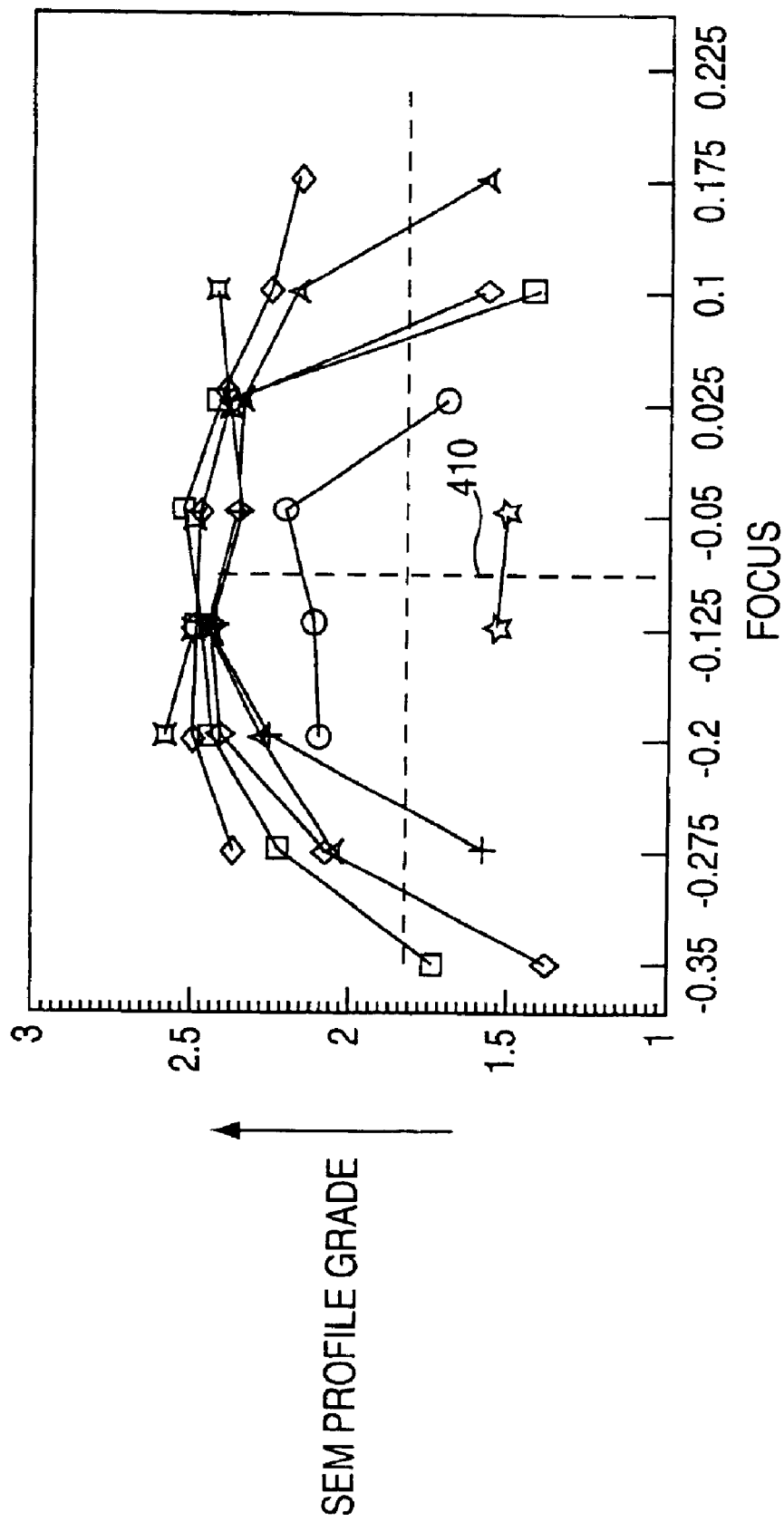
FIG. 4 shows the alternative 3 dimensional measurement for contact hole vs. focus tracking plotted at several different exposures, i.e. the profile measurement in an image contact.

FIG. 1A, at steps 173–179 represents a functional diagram depicting the product manufacturing set up calibration as practiced by a preferred implementation of the present invention. The prior art calibration as shown in 172 uses Bossung plots along with two dimensional critical dimension measurements to determine an optimal product focus offset. The optimal product focus offset is determined by locating the flat points, i.e. minimum or maximum on the Bossung plots as shown in FIGS. 1D, 2, 3 and 4. As known in the art, Bossung plots may be used in the tool calibration process to determine a nominal CD or focus. The Bossung plot 190 of FIG. 1D shows line CD as a function of focus for various exposure values. The Bossung plot 300 of FIG. 2 shows space dimension change as a function of focus over a range of exposure values. Note that in both the FIG. 1D and FIG. 2 plots, the curves trend to a flat part, i.e. minimum 185 for FIG. 1D and a maximum 320 for FIG. 2. From an inspection of either Bossung plot it is seen that this trend towards a minimum or maximum is independent of exposure levels. Either plot may be used to determine a nominal exposure by determining the flat part of the curves. Thus, in both Bossung plots, the flat part of the curves trend over a focus of −0.100 μm. That focus value being a nominal focus, i.e., optimal product focus offset, represents the center of the process window for the exposure tool. The exposure is then selected that yields the required critical dimension (CD) for the technology to be processed on the wafer. For example, as shown in FIG. 1D, at a focus of −0.100 μm, and 0.17 um line CD, the energy level of 22.5 mj/cm$^2$ should be used as indicated at maze line 195. That is, the nominal focus is chosen by selecting the dose, i.e., exposure, giving the required critical dimension at a focus position with the flattest CD response to that dose, for example, FIG. 1D focus line at 185 and FIG. 2 focus line at 320. The deficiency in this prior art technique is that it does not include a calibration method that can be used against measurements made on product, i.e., a production wafer, during the production phase to correct for tool focus variability. The inventive method of steps 173–179 overcome this problem by providing a calibration tool against which three dimensional feature measurements, e.g., edge width or contact hole profile, made on product during the production phase may be used to correct tool focus errors with respect to the optimal product focus offset. FIG. 1C depicts the variety of ways a line EW or contact hole profile measurement is taken. As shown in FIG. 1C i) an in focus imaged resist line scanned by a scanning electron microscope (SEM) reveals a relatively small line edge width 162 compared to the cross sectional line width 161 of the scanned line. At FIG. 1C ii) the defocus is revealed by a relatively large edge width 163 vs. the cross sectional line width 164 of the scanned line. As shown in FIG. 1C iii) an in focus imaged resist hole is shown to have a steep profile 165 going from the top to bottom of the hole, and in FIG. 1C iv), the defocused imaged resist hole has a relatively shallow top to bottom profile grade 166. As shown in FIG. 3, indicated by line 330, the location of optimal product focus offset can be identified on the line edgewidth versus focus curve, in which the relationship is sensitive to focus, but is independent of exposure dose.

This independence from exposure level can be used to determine whether a change in critical dimension is the result of exposure variations or tool variations, such as focus or x/y tilt. For example, if the 3D profile shows little or no change across extreme field site measurements, while 2D critical dimension has significantly greater change, then that change is attributable to exposure variations and may be adjusted accordingly. Otherwise, if a significant change in, for example, line edge width (a 3D independent measurement of focus) is observed across extreme field site measurements, then an appropriate focus adjustment may be made. Although the 3 dimensional measurements such as line edge width or contact hole profile represent independent measurements of tool focus, it has been shown that minimizing across field variation in edge width or contact hole profile also lowers the overall range of the critical dimensions, thereby additionally improving across the field line width variations (AFLV).

Figure 5:
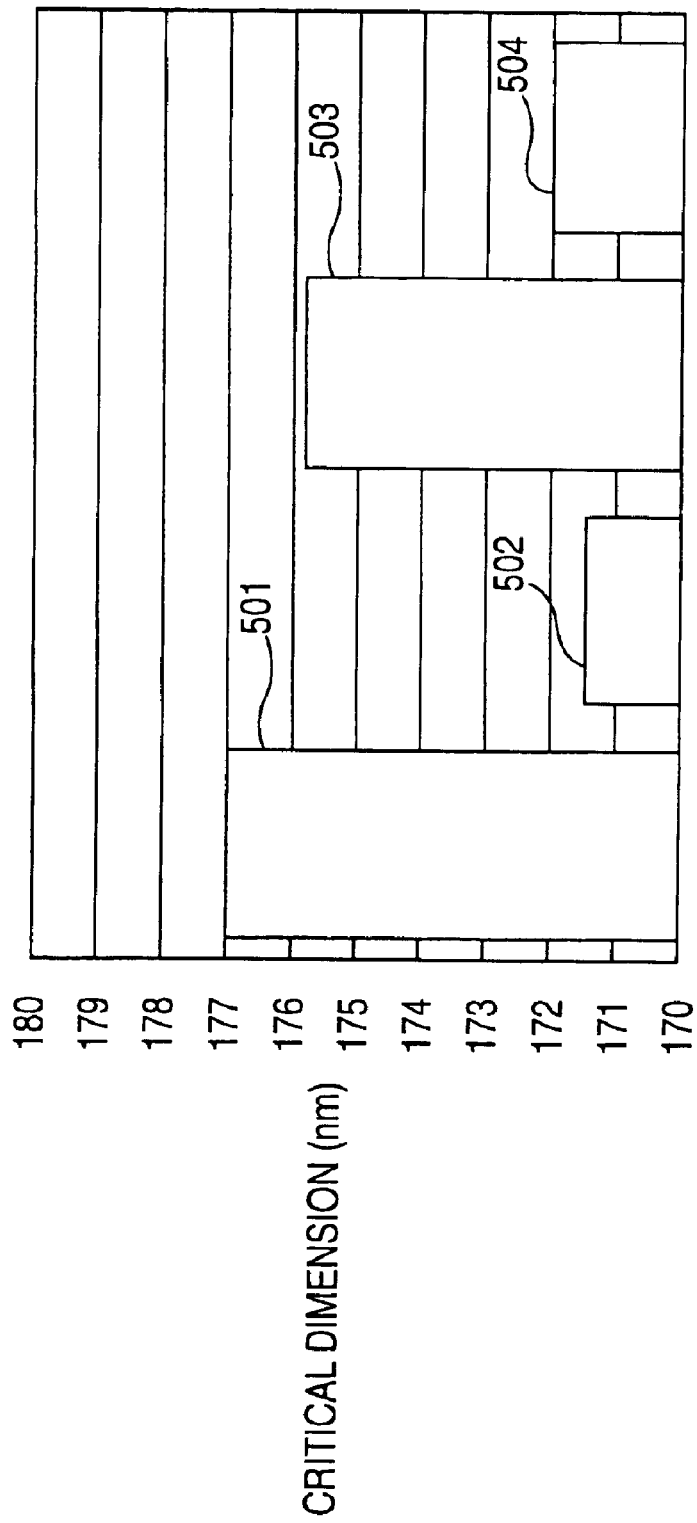
FIG. 5 shows an independent measurement of focus, which is critical for tightening Across the Field Line width Variation (AFLV). The graph illustrates large changes in the average isolated line critical dimension depending on the location within the exposure field (Lower Left, Lower Right, Upper Left and Upper Right)
Figure 6:
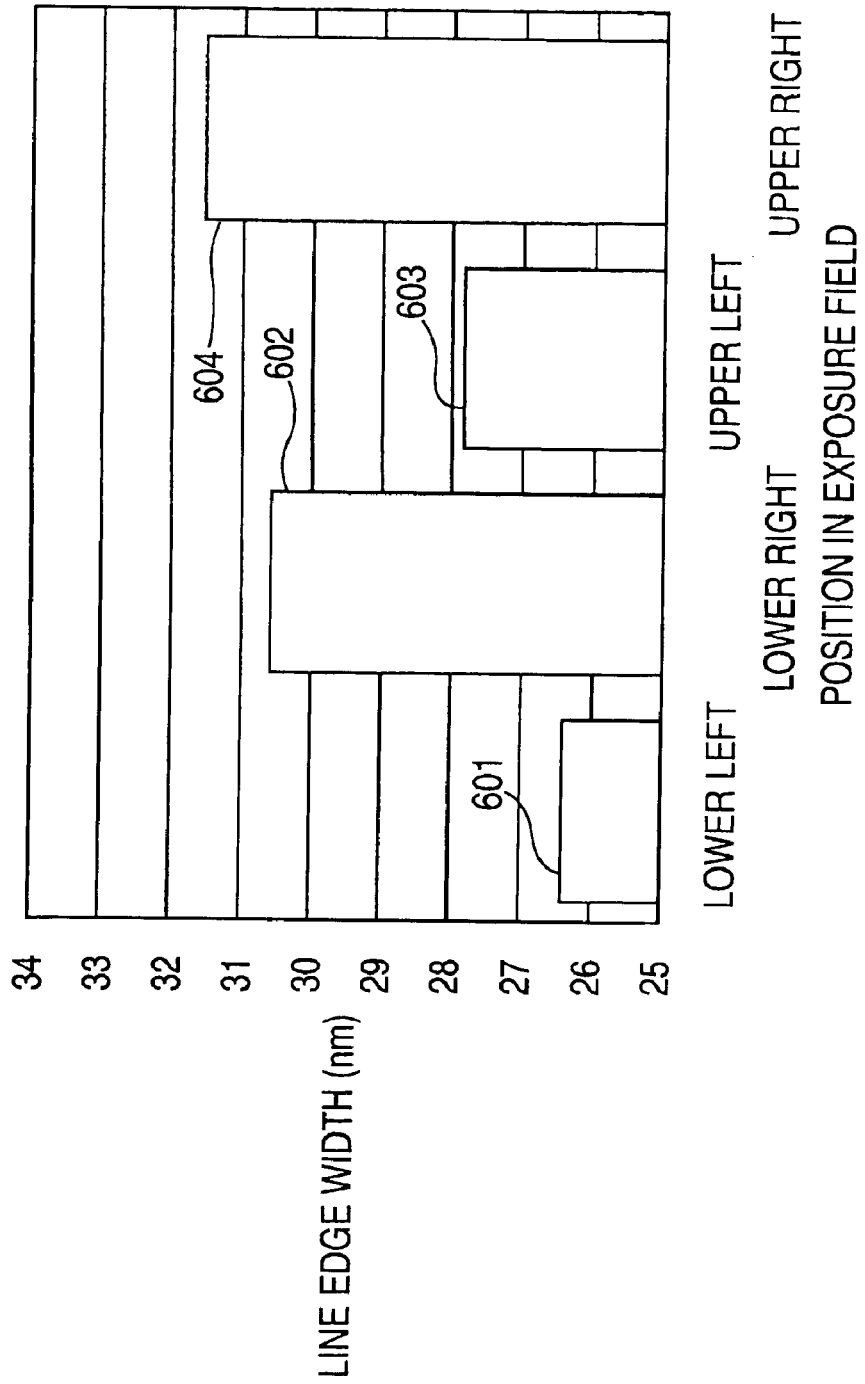
FIG. 6 shows the large differences in edge width at each of the 4 positions (Lower Left, Lower Right, Upper Left and Upper Right)

FIGS. 5 and 6 show the relationship between CD and EW for the extreme positions in the exposure field. It is observed that, for example as shown in FIG. 6, the right field line edge width variation at 604 and 602 is smaller than the left field line edge width variation at 603 and 601. As shown in FIG. 5 the right field CD variation at 504 and 502 is smaller than the left field CD variation at 503 and 501. Thus the CD variations correlate with the EW variations, and selecting focus and tilt values that minimize EW variations, as is done in the present invention, results in an across field improvement in CD.

Figure 8:
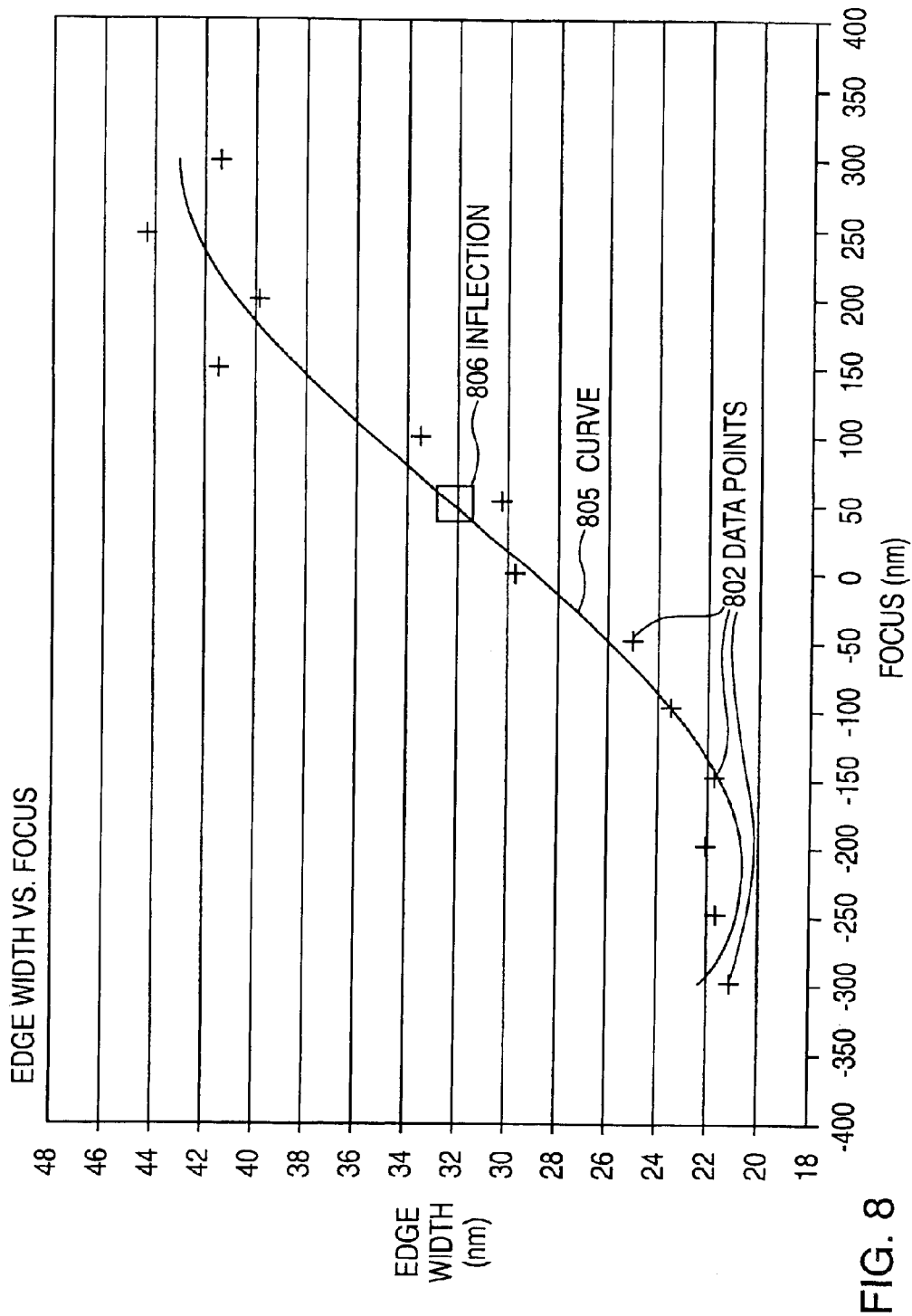
FIG. 8 shows the empirically derived cubic equation representing a calibration plot from which the edge width number can be translated into an actual focus measurement.

Returning to FIG. 1A at steps 173 through 179, the steps as discussed below may be performed by a suitably programmed computer. As shown at step 173, for a given masking level, resist, arc thickness, exposure illumination type and reticle design, a focus exposure wafer is created under varying focus and exposure energy conditions across the wafer. Edge width (EW) is then measured for each focus/exposure condition or variant at step 174. EW vs. focus for each exposure level is then plotted at step 175. A nominal exposure, i.e., nominal energy level, is selected. This nominal exposure may be determined from a Bossung plot such as shown in either FIG. 1D or FIG. 2. Alternatively, the nominal exposure may be determined from a table of run rules such as illustrated in column 1360 of FIG. 13. Once the nominal exposure, i.e. default exposure level, has been selected, edge width vs. focus data at that nominal exposure level may be extracted from the recorded measurement data. Thus, a plot of edge width (EW) vs. focus, for each exposure level is created from the data collected and plotted at steps 174, 175. At step 176, a curve which corresponds to the default exposure level is fitted to the plot of step 175. This curve, known as a calibration curve, may be determined by using well known mathematical techniques, such as a least squares polynomial method, and results in a function comprising at least a 3$^{rd}$ order, e.g., cubic equation. At step 177 an inflection point of the calibration curve is then located where the second derivative of the function is equal to zero. This point denotes the best profile for the critical feature, as shown in step 178. As shown in step 179, the best profile corresponds with and is equal to the prior art calculated optimal product focus offset discussed above. Referring now to FIG. 8, therein is illustrated a representative calibration curve 805 with its respective inflection point 806 fitted to the raw data points 802. Mathematically, the inflection point 806 is found by solving the equation, $y''=0$ (where the function $y=Ax^3+Bx^2+Cx+D$, represents the calibration curve, and necessarily, $y''=6Ax+2B$). Thus, solving the equation $6Ax+2B=0$ for x, where $x=-\frac{1}{3}(B/A)$, results in the best profile, i.e., optimal product focus offset. The edge width corresponding to optimal product focus offset is then located on the calibration curve in FIG. 8. This value of edge width represents the target EW for a particular photolithographic exposure tool and process. Note that the optimal product focus offset, as calculated by the preferred implementation of the present invention is based on the empirical relationship between EW and tool focus offset, i.e. the calibration curve 805 created as shown in FIG. 8. Additionally, the calibration curve 805 may be used along with three dimensional measurements made on product, i.e., a production wafer, during manufacturing to determine a measured focus which, if different from the optimal product focus offset, represents a bias from the optimal product focus offset which may then be fedback to the photolithographic exposure tool, correcting z focus for a future lot of product.

Figure 1B:
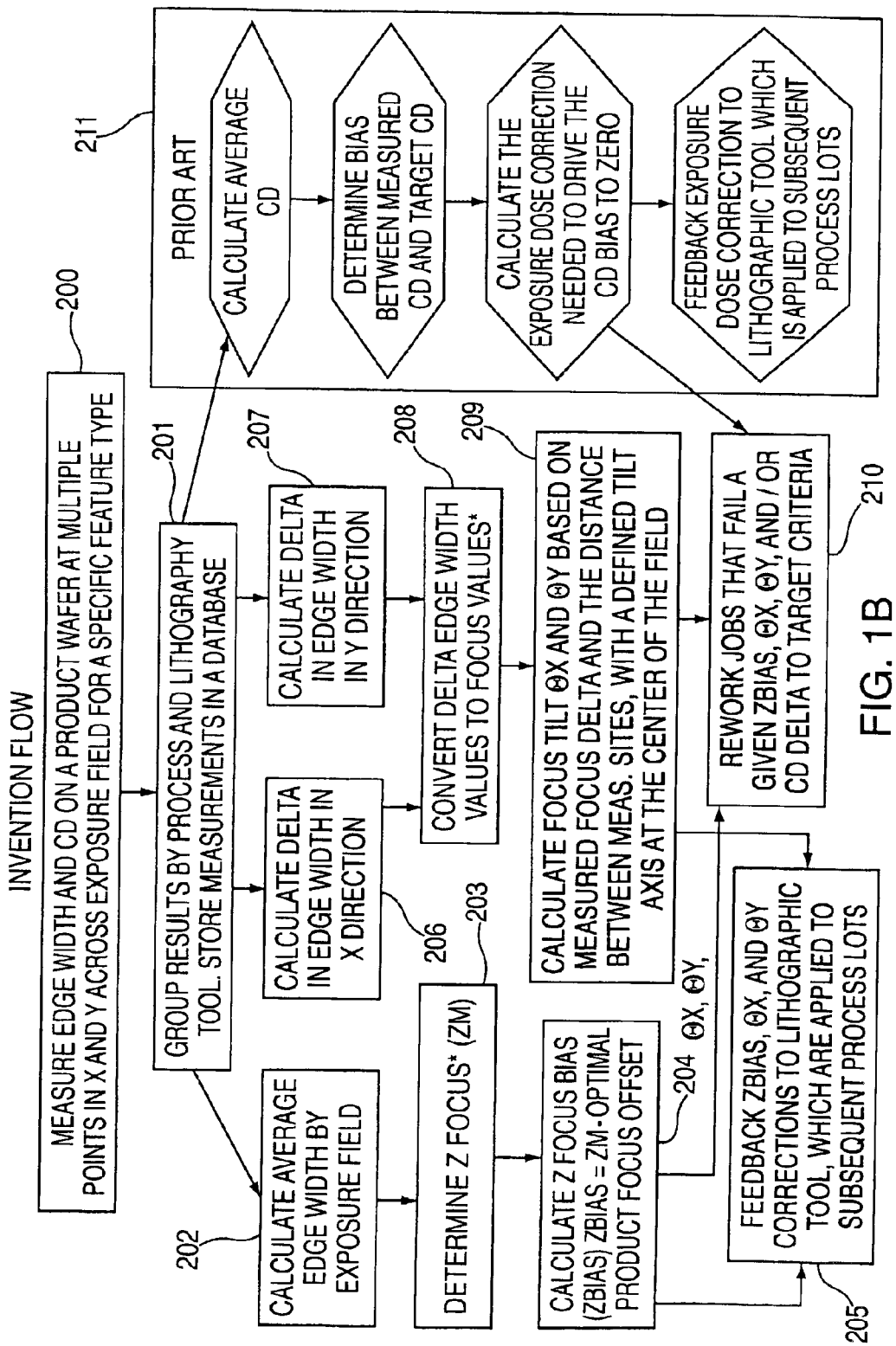
FIG. 1B shows a functional block diagram for z focus and x/y tilt calculation using a preferred implementation of the present invention in the manufacturing phase.

FIG. 1B is a functional diagram depicting the product manufacturing process steps 200–210 of the present invention. All of the subsequent steps discussed below may be performed manually, or automatically by a suitably programmed computer. As shown in FIG. 1B at step 200, EW and CD measurements are taken at multiple points across the exposure field for a specific feature type, e.g., line or contact hole. Measurement data is collected and grouped by process and lithography tool as indicated at step 201. A database may be used to store this measurement data.

At step 202, a calculated average left EW and average right EW is used as an EW point for a given focus. This represents an average edge width by exposure field. At step 203 a z focus, Zm, i.e., a measured focus, is determined from the average measurements of step 202. The EW vs. focus, i.e., calibration curve (805 FIG. 8) is used for this determination. The average EW corresponding to step 202 is located on the calibration curve, the corresponding focus is the measured focus, Zm. Because the calibration curve is independent from exposure dose variations, any difference, i.e., bias, of Zm from the optimal product focus offset at step 179, FIG. 1A, represents a tool focus variation which should be corrected. This bias, referred to as Zbias, is calculated at step 204. If the bias exceeds a predetermined number, then the current job, i.e., lot under which the measurements 200 were taken is reworked at step 210. Otherwise Zbias is fedback as a z focus correction to the lithographic tool for application to subsequent process lots at step 205.

Figure 14:
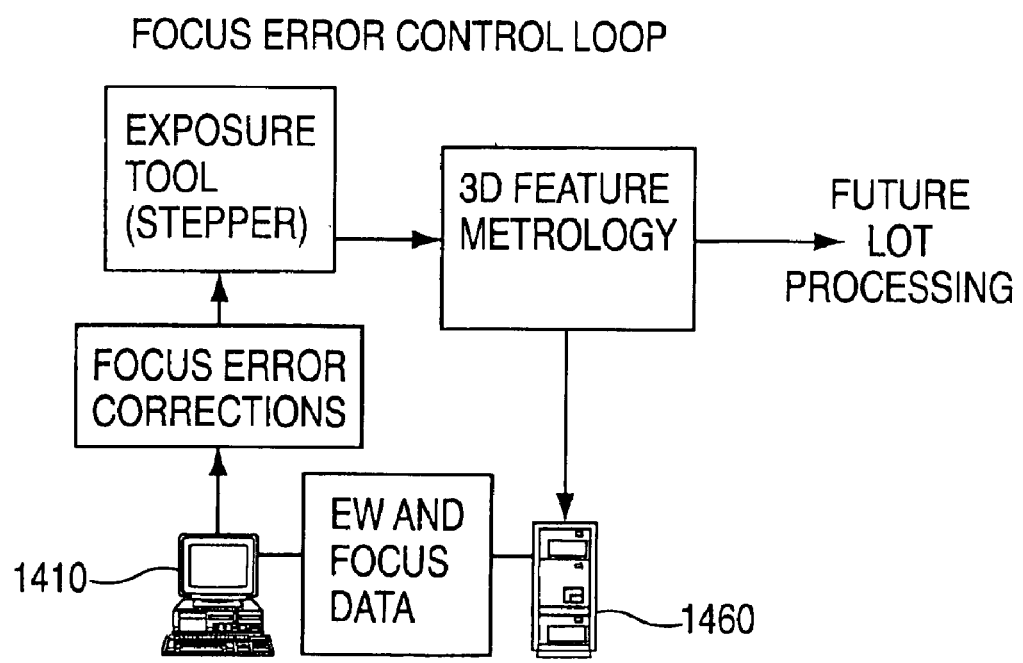
FIG. 14 shows a computer controlled focus error control loop of the present invention.

In a preferred embodiment, this calculation is carried out by computer (FIG. 14, 1410), typically the same computer that manages the data collection, data storage, plotting and curve fitting discussed above.

Figure 7:
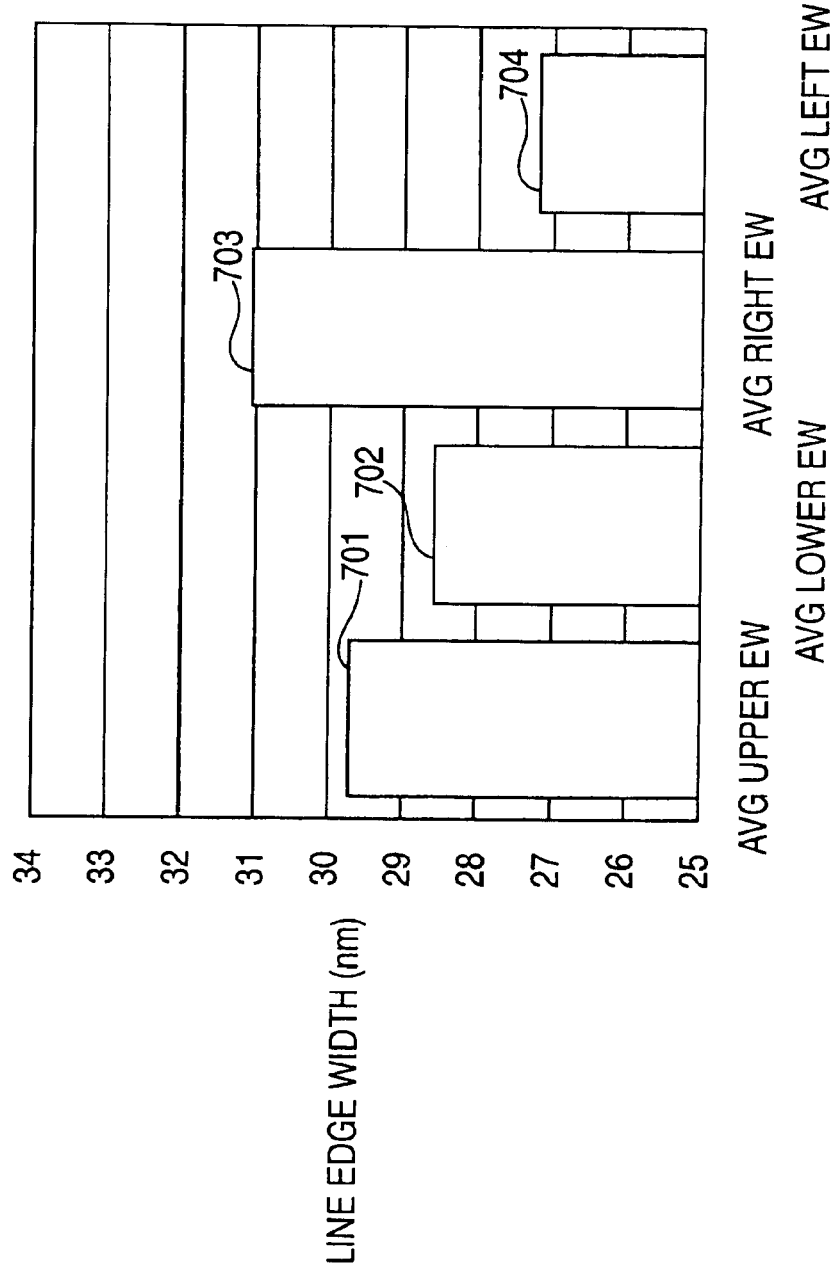
FIG. 7 shows the line edge width vs. average upper, lower, left and right measurements for determining an actual X/Y tilt of the exposure field plane.
Figure 9:
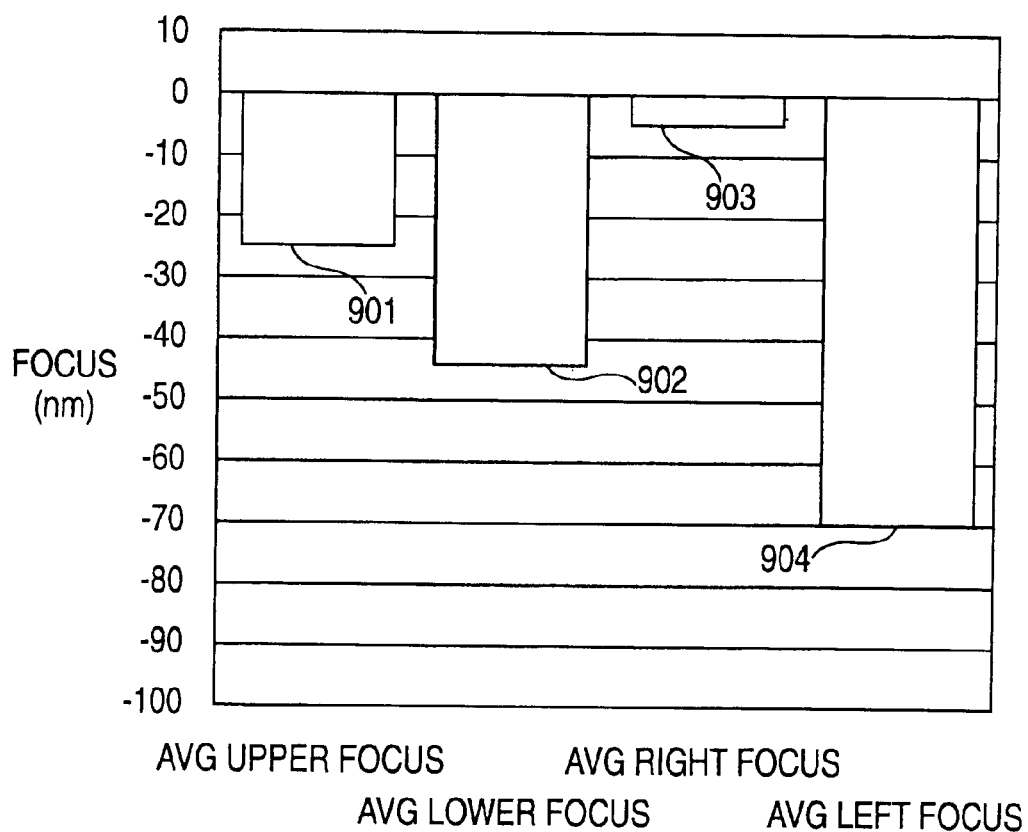
FIG. 9 shows X/Y exposure field tilt (Average Upper Focus, Average Right Focus, Average Lower Focus, Average Left Focus—horizontal axis) in terms of focus (vertical axis)

In a similar manner, the preferred implementation of the present invention calculates, then applies x/y tilt corrections to a photolithographic exposure tool. As shown in FIGS. 7 and 9, the relationship between average upper focus 901 and average lower focus 902 corresponds to the relationship between average upper EW 701 and average lower EW 702, and may be used to derive a y-axis or "y" tilt. Similarly, the relationship between average right focus 904 and average left focus 903 corresponds to the relationship between average right EW 703 and average left EW 704 and may be used to derive an x-axis or "x" tilt. Referring to FIG. 1B at steps 206 through 209, it is shown that in a similar manner as described herein, the x/y tilt may be optimized by using the 3D profile measurement changes vs. extreme exposure field positions and, a trigonometric relationship between the measurements and exposure field positions. Assuming that the measurement, grouping and storing steps of FIG. 1B at steps 200, 201 have already been performed, the changes in edge width in the x direction corresponding to right-left edge width changes are calculated at step 206, and the changes in edge width in the y direction corresponding to upper-lower edge width changes are calculated at step 207. As shown in FIG. 7, these measurements are then averaged to include an average upper EW, an average lower EW, an average left EW, and an average right EW to aid in determining an actual x/y tilt of the exposure field plane. In FIG. 1B at step 208, the average EW's of FIG. 7 are then used in conjunction with the edge width vs. focus calibration curve of FIG. 8 to derive an average upper focus, average lower focus, average right focus, and average left focus.

Figure 10:
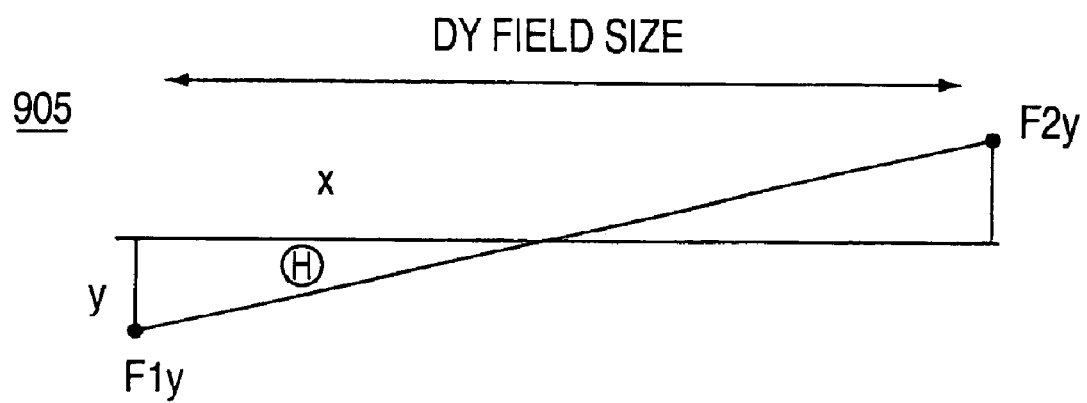
FIG. 10 shows the geometry for calculation of the y tilt for feedback to the exposure tool. A rotation of the figure clockwise by 90 degrees defines how the calculation of the x tilt should be performed.

Referring now to FIG. 1B at step 209, and FIG. 10, focus tilt values $\theta_x$, and $\theta_y$ are calculated. Since variables $D_y$, the distance between the upper measurement site and the lower measurement site, $F2_y$, the average upper focus, and $F1_y$, the average lower focus are known, a trigonometric relationship 905 such as that illustrated in FIG. 10, is applied to calculate the angle, $\theta_y$ of the y tilt which is arctan y/x, and which resolves to:

$$\theta_y = \arctan((F2_y - F1_y)/D_y) * (Pi/180) * 1E6 \text{ microradians.}$$

Similarly, by a 90° rotation of the trigonometric relation 905 in FIG. 10, the relationship arctan y/x is maintained for the angle, $\theta_x$ of the x tilt, and is calculated from $D_x$, the known distance between the left and right measurement sites, $F2_x$, the average right focus, and $F1_x$, the average left focus as follows:

$$\theta_x = \arctan((F2_x - F1_x)/D_x) * (Pi/180) * 1E6 \text{ microradians.}$$

For both $\theta_x$, and $\theta_y$ the (Pi/180)*1E6 factor is used to convert the $\theta$ angles from degrees to microradians, a common unit of measurement used in exposure tools.

Returning to FIG. 1B, at step 210, similar to the check for Zbias, a check of the tilt offsets, $\theta_x$, and $\theta_y$ is performed. If any of these values are outside of a predetermined limit, further adjustments are halted and the job is flagged for rework.

Figure 11:
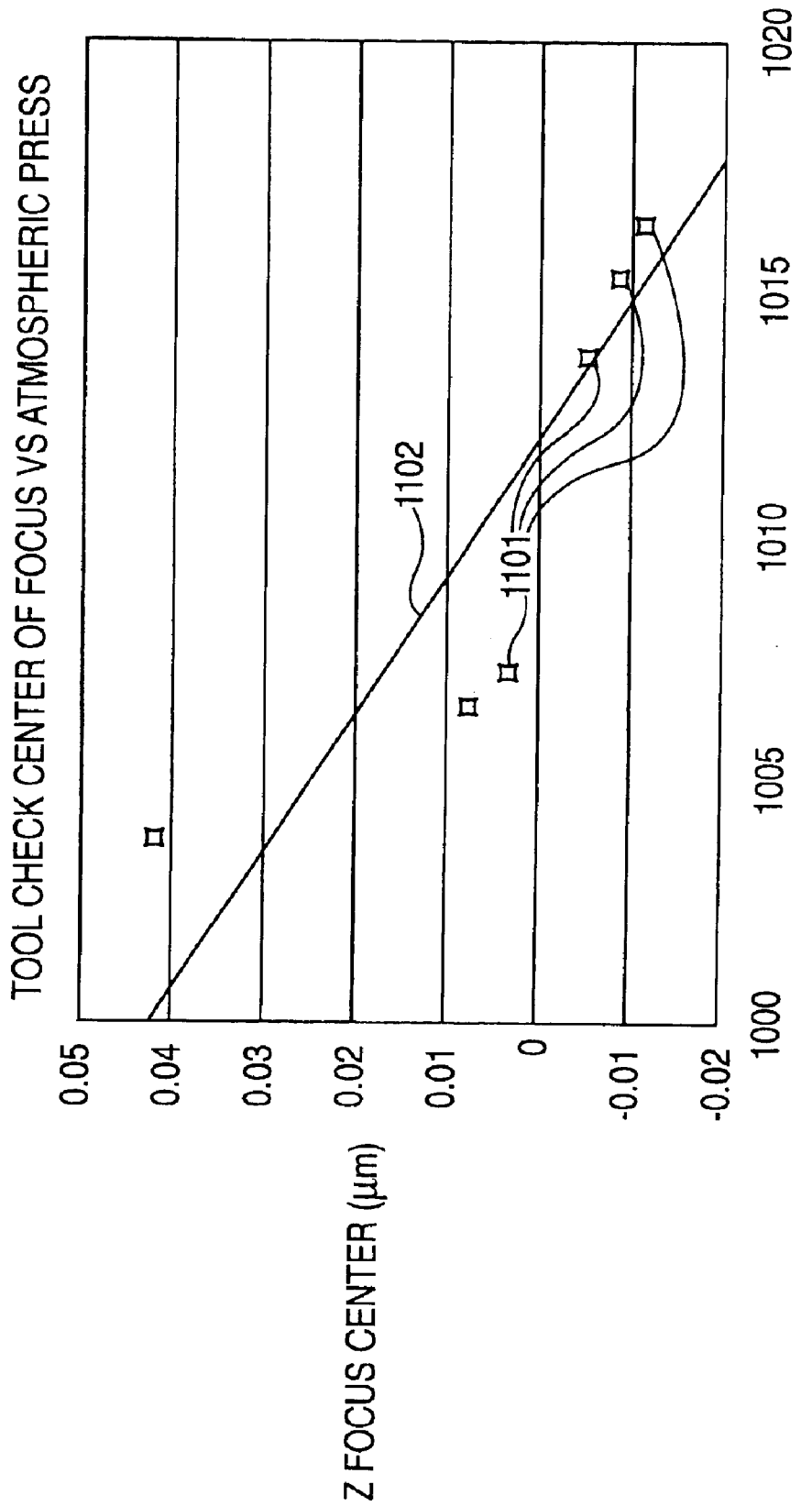
FIG. 11 shows the relationship between tool check center of focus vs. atmospheric, i.e. barometric pressure.
Figure 12:
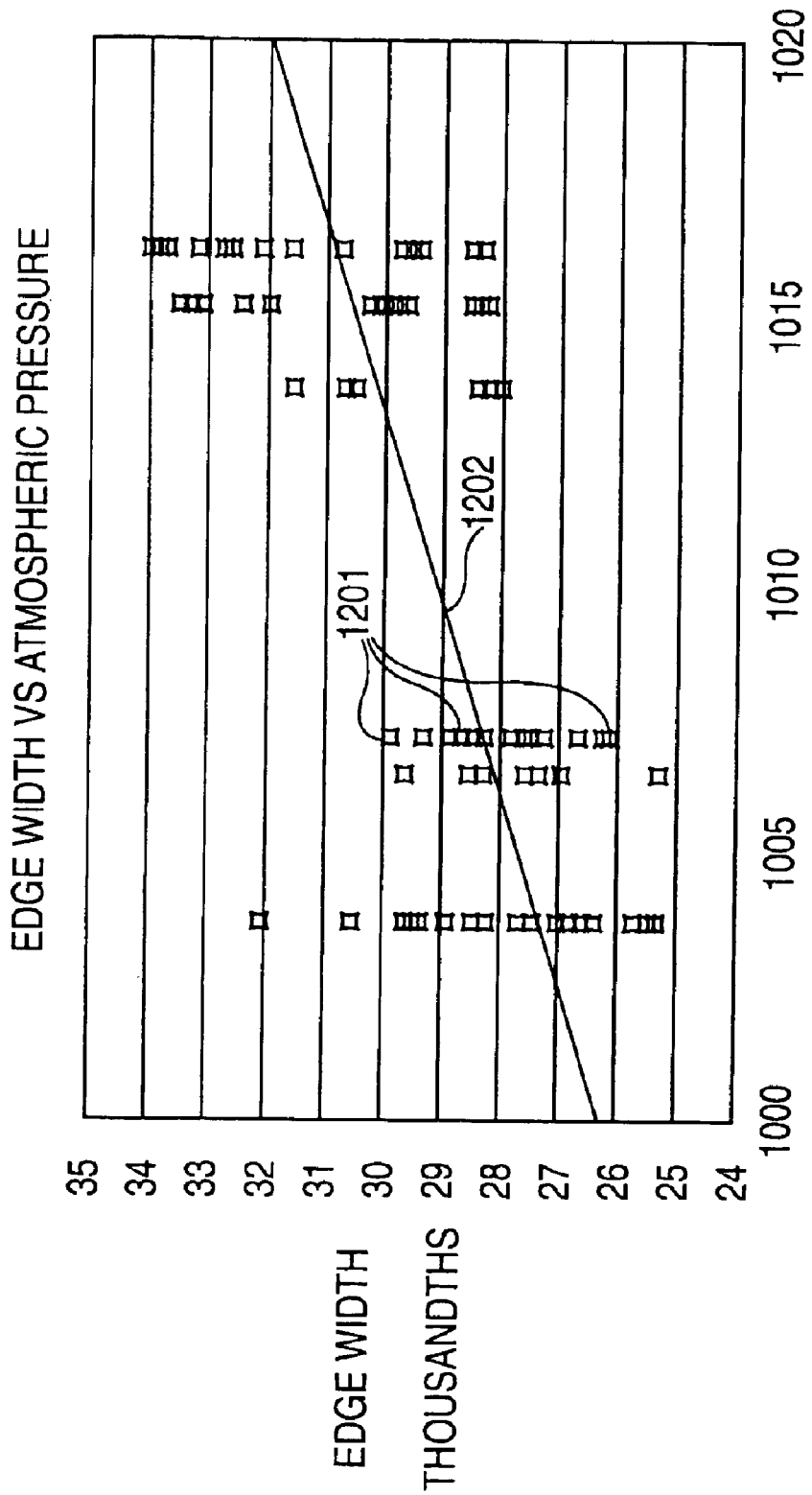
FIG. 12 shows the relationship between edge width (EW) vs. atmospheric pressure.

The preferred methods of the present invention can also be used to indicate problems with the focusing system on a photolithographic exposure tool. For example, if the focusing system on a malfunctioning tool is not properly compensating for changes in the barometric pressure, such an error can be seen in the standard tool focus checks on monitor wafers as a change in z focus with barometric pressure. As shown in FIG. 11, linear regression of the raw data points 1101 of this z focus change with barometric pressure yields the relationship indicated by line 1102. Additionally, 3D line edge width measurements can also detect the problem on standard product measurements as indicated by points 1201 in FIG. 12, where Edge width varies as a function of barometric pressure. Linear Regression, line 1202, indicates the edge width varying as a function of barometric pressure. The use of EW vs. pressure trend for a tool check center of focus results in an advantage over standard monitor tool checks because the mean time to detect a problem is smaller with the EW technique.

A computer with non-volatile, i.e. hard drive, storage capability 1410 is provided for performing profile and line edge calculations required to produce z focus and x/y tilt settings. The storage is used for maintaining a database 1460 with the relevant across field line width variation information stored therein, including but not limited to Lower Left, Lower Right, Upper Left, and Upper Right imaged photoresist critical dimensions. Additionally Average Upper EW, Average Lower EW, Average Right EW, and Average Left EW are computed and stored for data processing which will result in an actual x/y tilt of the exposure field plane. The computer calculates and stores an empirically derived equation from which the edge width number is translated into an actual focus measurement.

Thus, the preferred method of the present invention can achieve target CD by measuring line edge width and contact hole space variations in resist profile, then relating the variations to changes in focus wherein a function is defined for computing a focus correction thereby allowing feed back of the focus correction to the stepper tool being used.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

What is claimed:

1. A method of controlling the focus errors of a photolithographic exposure tool comprising the steps of:
   a) making measurements of three dimensional feature changes in a photosensitive resist, wherein said measurements of three dimensional feature changes include a plurality of edge width measurements and said plurality of said edge width measurements correspond to changes in profile angle of said photosensitive resist;
   b) generating a function which defines a relationship between said measurements of three dimensional features changes and a focus of said photolithographic exposure tool; and
   c) computing from said function a best profile focus value wherein said best profile focus value is used for controlling the focus errors of said photolithographic exposure tool.

2. The method of controlling the focus errors of a photolithographic exposure tool as claimed in claim 1 wherein said step a) comprises:
   exposing a focus expose matrix wafer by varying exposure levels and focus conditions wherein said measurements of three dimensional feature changes include said plurality of edge width measurements versus focus data points for any given one of said exposure levels.

3. The method of controlling the focus errors of a photolithographic exposure tool as claimed in claim 1, wherein said measurements of three dimensional feature changes of said step a) are stored by a computer.

4. The method of controlling the focus errors of a photolithographic exposure tool as claimed in claim 2, wherein said plurality of edge width measurements versus focus data points are plotted for each of said exposure levels.

5. The method of controlling the focus errors of a photolithographic exposure tool as claimed in claim 2 wherein said plurality of edge width measurements vs. focus data points are retained for a default exposure level.

6. The method of controlling the focus errors of a photolithographic exposure tool as claimed in claim 5, wherein step b) comprises computing a derived equation which characterizes said plurality of edge width measurements vs. focus data points to define said function.

7. The method of controlling the focus errors of a photolithographic exposure tool as claimed in claim 6, wherein a second derivative of said derived equation is solved to obtain said best profile focus value for said measurements of three dimensional feature changes where said second derivative is equal to zero.

8. The method of controlling the focus errors of a photolithographic exposure tool as claimed in claim 7, wherein measurements of a specific three dimensional feature type are made across an exposure field on a production wafer.

9. The method of controlling the focus errors of a photolithographic exposure tool as claimed in claim 8, wherein said measurements of said specific three dimensional feature type comprise edge width measurements.

10. The method of controlling the focus errors of a photolithographic exposure tool as claimed in claim 9, wherein an average of said edge width measurements is calculated.

11. The method of controlling the focus errors of a photolithographic exposure tool as claimed in claim 10, wherein said average of said edge width measurements is input to said function to derive a measured focus of said specific three dimensional feature type on said production wafer.

12. The method of controlling the focus errors of a photolithographic exposure tool as claimed in claim 11, wherein a difference between said measured focus and said best profile focus value is fedback to said photolithographic exposure tool thereby controlling focus errors of said photolithographic exposure tool.

13. The method of controlling the focus errors of a photolithographic exposure tool as claimed in claim 11, wherein a difference between said measured focus and an optimal product focus offset is fedback to said photolithographic exposure tool thereby controlling focus errors of said photolithographic exposure tool.

14. The method of controlling the focus errors of a photolithographic exposure tool as claimed in claim 6, wherein said derived equation which characterizes said plurality of edge width measurements vs. focus data point to define said function is a cubic of the form:

$$y = Ax^3 - Bx^2 + Cx + D,$$

where y is the edge width, x is the focus, A, B, C and D are empirically derived coefficients.

15. The method of controlling the focus errors of a photolithographic exposure tool as claimed in claim 7, wherein said second derivative solving step results in an equation:

$$6Ax + 2B = 0,$$

wherein the solution x representing said best profile focus value is governed by the equation:

$$x = -\tfrac{1}{3} * (B/A)$$

wherein A and B are empirically derived coefficients.

16. A system for controlling the focus errors of a photolithographic exposure tool comprising:
   a) means for measuring three dimensional feature changes by a plurality of edge width measurements in a photosensitive resist, wherein said edge width measurements correspond to changes in profile angle of said photosensitive resist;
   b) function generation means for defining a relationship between said plurality of edge width measurements and focus of said photolithographic exposure tool;
   c) means for determining from said function a best profile focus value wherein said best profile focus value is used to control the focus errors of said photolithographic exposure tool.

17. The system as claimed in claim 16 for controlling the focus errors of a photolithographic exposure tool, wherein said means for measuring said three dimensional feature changes further comprises:
   means for obtaining measurements of said three-dimensional feature changes based on varying exposure levels and focus conditions wherein said measurements include said plurality of edge width measurements versus focus data points for any one of said exposure levels.

18. The system as claimed in claim 17 for controlling the focus of a photolithographic exposure tool wherein said function generation means includes means for deriving an equation which characterizes said edge width versus focus data point for a default exposure level to thereby define said function.

19. The system as claimed in claim 18 for controlling the focus errors of a photolithographic exposure tool further including means for solving a second derivative of said equation for said best profile focus value wherein said second derivative is equal to zero.

20. The system for controlling the focus errors of a photolithographic exposure tool as claimed in claim 19 wherein an average of measurements of a three dimensional feature type on a production wafer is input to said function to derive a measured focus of said three dimensional feature type on said production wafer.

21. The system for the focus errors of a photolithographic exposure tool as claimed in claim 20 wherein a difference between said measured focus and said best profile focus value is fedback to said photolithographic exposure tool thereby controlling focus errors of said photolithographic exposure tool.

22. The system for confrolling focus errors of a photolithographic exposure tool as claimed in claim 20 further comprising:
   d) means for obtaining x/y tilt values including a y tilt value, $\theta_y$, corresponding to a trigonometric relationship that relates a distance, $D_y$ between measurement sites on said production wafer, an edge width derived focus, $F1_y$ taken from the extreme lower position of an exposure field, and an edge width derived focus, $F2_y$, taken from an extreme upper position of the exposure field;
   e) means for obtaining said x/y tilt values including an x tilt value, $\theta_x$, corresponding to a trigonometric relationship relating a distance $D_x$ between measurement sites on said production wafer, and edge width derived focus $F1_x$ taken from the extreme bottom position of said exposure field, and an edge width derived focus, $F2_x$ taken from the extreme top position of said exposure field;
   f) means for correcting said photolithographic exposure tool with said tilt values, $\theta_x$, $\theta_y$.

23. A computer program product comprising:
   a computer usable medium having computer readable program code embodied therein executable by a computer for implementing focus error control of a photolithographic exposure tool, the computer readable program code in said computer program product comprising:
   a) first computer readable program code for causing a computer to measure three dimensional profile changes of a feature in a photosensitive resist;
   b) second computer readable program code for causing the computer to store said three dimensional profile changes, wherein said three dimensional profile changes correspond to changes in profile angle of said photosensitive resist; c) third computer readable program code for causing the computer to generate a function which defines a relationship between said three dimensional profile changes and said focus of said photolithographic exposure tool;
   d) fourth computer readable program code for causing the computer to calculate from said function a best profile focus value wherein said best profile focus value is used to control the focus errors of said photolithographic exposure tool.

24. The computer program product as claimed in claim 23 comprising a fifth computer readable program code for inputting to said function an average of measurements made on a specific three dimensional feature type across an exposure field on a production wafer to derive a measured focus of said specific three dimensional feature type on said production wafer.

25. The computer program product as claimed in claim 24 comprising a sixth computer readable program code for computing a difference between said measured focus and said best profile focus value, then feeding back said difference to said photolithographic exposure tool wherein said focus errors of said photolithographic exposure tool are controlled.

26. The computer program product as claimed in claim 25 comprising:
   seventh computer readable program code for causing the computer to calculate x-axis/y-axis tilt values from said measured focus, wherein said x-axis/y-axis tilt values are used to control tilt errors of said photolithographic exposure tool whereby an optimum x-axis/y-axis tilt offset is achieved.

* * * * *